United States Patent

Knudsen et al.

[11] Patent Number: 5,724,868
[45] Date of Patent: Mar. 10, 1998

[54] METHOD OF MAKING KNIFE WITH CUTTING PERFORMANCE

[75] Inventors: Harold L. Knudsen, Escondido; Nathan K. Meckel, La Mesa, both of Calif.; Herbert M. Gabriel, Bensheim, Austria; Harold O. Knudsen, Sherwood, Oreg.

[73] Assignees: Buck Knives, Inc.; Molecular Metallurgy, Inc., both of El Cajon, Calif.

[21] Appl. No.: 585,177

[22] Filed: Jan. 11, 1996

[51] Int. Cl.$^6$ .................................................. C23C 14/22
[52] U.S. Cl. ........................ 76/104.1; 76/DIG. 6; 30/350; 204/192.3
[58] Field of Search .......................... 30/346.54, 350; 76/101.1, 104.1, 108.1, 108.2, 108.4, 108.6, DIG. 6, DIG. 8, DIG. 11; 204/192.3

[56] References Cited

U.S. PATENT DOCUMENTS

| | | | |
|---|---|---|---|
| 3,988,955 | 11/1976 | Engke et al. | 30/350 X |
| 4,653,373 | 3/1987 | Gerber | 30/350 X |
| 4,933,058 | 6/1990 | Bache et al. | 204/192.3 |
| 5,232,568 | 8/1993 | Parent et al. | 30/346.54 X |
| 5,431,071 | 7/1995 | Williams | 76/104.1 |

OTHER PUBLICATIONS

Herbert M. Gabriel, "Vacuum Arc Discharges Used to Deposit hard Wear Resistant Coatings onto Tools", *IEEE Trans. on Plasma Science*, vol. 21, No. 5 (Oct. 1993).
Declaration of Nathan K. Meckel and attached Press Release of Molecular Metallurgy, Inc., dated on its face Jan. 1995.

*Primary Examiner*—Douglas D. Watts
*Attorney, Agent, or Firm*—Gregory Garmong

[57] ABSTRACT

A coating material such a TiN, Ti(CN), or (TiAl)N is deposited onto the blade edge region of a steel knife blade blank by a cathodic arc process using linear deposition sources with simultaneous heating and rotation of the blade blank relative to the deposition sources. The blade edge region may be sharpened or unsharpened prior to deposition of the coating material. If the blade edge region is unsharpened prior to deposition, it is thereafter sharpened, preferably on one side only.

15 Claims, 6 Drawing Sheets

METHOD OF MAKING KNIFE WITH CUTTING PERFORMANCE

BACKGROUND OF THE INVENTION

This invention relates to knives, and, more particularly, to a knife with a hard-coated blade.

A knife includes a cutting blade having a sharpened edge region. In service, the blade is used to cut a workpiece using a slicing action. Accordingly, the blade is made relatively thin with one edge gradually reduced in thickness to define the sharpened edge.

The cutting performance of the knife is determined to a large extent by the ability to initially form the sharpened edge and thereafter to retain that sharpened edge during repeated use in service. A reduction in the sharpness with use (i.e., dulling of the knife blade) is accompanied by a degradation in the quality of the cut region of the workpiece and an increase in the force required to move the knife blade into the workpiece. After the cutting edge has become dulled, it may be restored to its original performance by a resharpening of the blade. The sharpening of the blade involves removal of a small amount of material at the cutting edge to re-establish the finely sharpened edge.

Good sharpness retention is associated with a cutting edge made of a hard, wear-resistant material which can make many cuts before resharpening is required. Metallic knife blades are typically made of a heat-treatable material such as a steel which is hardened at the cutting edge but left softer and tougher in the interior and tang regions so as to resist brittle fracture. For example, a typical 400-series stainless steel knife blade may be heat treated to a hardness of about 58–60 $R_C$ (Rockwell C hardness scale) in the cutting edge region but tempered to a hardness of about 55 $R_C$ in the remainder of the blade and the tang.

The cutting edge can also be hardened by carburizing, nitriding, or other treatment technique that locally hardens the blade. Even with such treatments, however, the improvement to cutting performance is only moderate. Thus, although existing blade-manufacturing techniques are operable and widely used, there is always a need for a technique that yields improved cutting performance of the blade without excessive increases in manufacturing costs. The present invention fulfills this need, and further provides related advantages.

SUMMARY OF THE INVENTION

The present invention provides a knife blade and an approach for manufacturing a knife blade, and the resulting knife made using the blade. The metal knife blade of the invention has improved, in many cases vastly improved, cutting performance as compared with conventional metal knife blades. The cutting performance improvement is achieved through the application of an adherent coating to the knife blade, which coating is also visually attractive, low-friction, wear-resistant, and corrosion-resistant. The improvement in performance is achieved with modest increased cost.

In accordance with the invention, a method for preparing a knife comprises the steps of providing a knife blade blank having a blade edge region with two sides and providing a deposition apparatus. The deposition apparatus comprises at least two linear deposition sources, each of the deposition sources lying parallel to an axis and each of the deposition sources being a source of a cationic species. The deposition apparatus further comprises an anion source of an anionic species reactive with the cationic species to produce a coating material, a substrate support adapted for rotational movement about the axis, and a substrate heater. The knife blade blank is mounted in the substrate support such that the blade edge region lies generally parallel to the axis and such that the blade edge region faces each respective deposition source at about its position of closest approach to the respective deposition source. The method further includes heating the knife blade blank to a substrate deposition temperature, rotating the substrate support about the axis, and operating the deposition sources to deposit the respective coating material onto the knife blade blank. The steps of heating, rotating, and operating are performed simultaneously.

The deposition sources are preferably cathodic arc sources, but may be other types such as sputtering sources. The deposition sources are operated so as to deposit from about 1½ to about 5 micrometers of a coating onto the sides of the knife blade blank. The coating preferably includes a layer of a titanium compound such as titanium nitride, titanium carbonitride, titanium-aluminum nitride, or titanium-aluminum carbonitride, deposited over a base layer of titanium. Other cationic species may be used as well. The cationic material produced in the deposition source may also be an alloy, such as Ti-6Al-4 V, that is reacted with the anionic species to produce the hard coating material.

The knife blade blank may be sharpened or unsharpened when the hard material is deposited at the blade edge region. If unsharpened, the blank is thereafter sharpened, either on two sides or, most preferably, on one side only. In the latter case, the hard material region extends to the cutting edge on the unsharpened side, contributing to the resistance of the sharpened edge of the knife blade to dulling during service. Tests demonstrate that, in the latter case, cutting performance of the knife of the invention is improved by hundreds to thousands of times over that of conventional knives. Additionally, the coating may be selected to have an attractive appearance which is not readily removed during service. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 6A–C is a series of enlarged cross sectional views of the knife blade portion of the knife of FIG. 2, taken along lines 6—6, wherein FIG. 6A shows a first embodiment, FIG. 6B shows a second embodiment, and FIG. 6C shows a third embodiment;

DETAILED DESCRIPTION OF THE INVENTION

Figure 1:
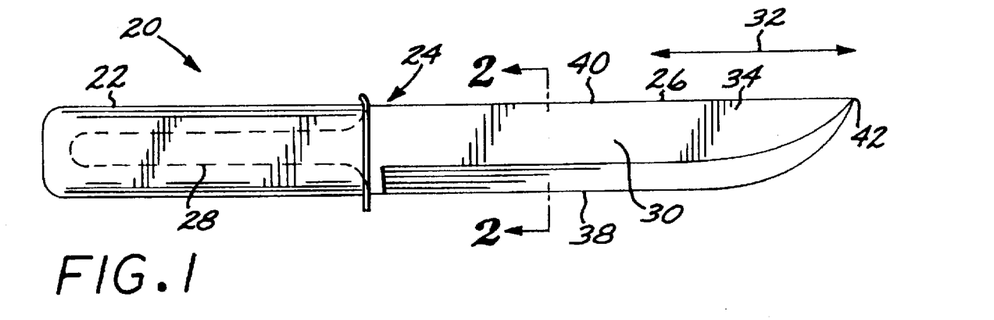
FIG. 1 is an elevational view of a knife, with an interior portion of the knife shown in phantom view.

FIG. 1 depicts a knife 20 having a handle 22 and a blade/tang unit 24. The blade/tang unit 24 includes a blade 26 and an integral tang 28 that is affixed to the handle 22. The blade/tang unit 24 is normally fabricated separately from the handle as a single piece, and then is assembled to or overmolded with the handle 22. FIG. 1 shows a fixed blade knife 20. The present invention is equally applicable both to a fixed-blade knife such as a hunting knife and to a retractable blade knife such as a folding-blade knife of the pocket-knife type.

Figure 2:
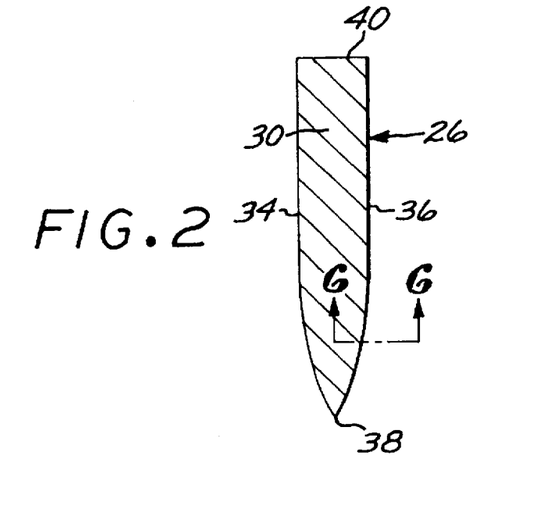
FIG. 2 is a sectional view of the knife blade portion of the knife of FIG. 1, taken along lines 2—2.

The blade 26 includes a flat, elongated blade body 30 extending generally parallel to a blade body axis 32. As seen in FIGS. 1 and 2, the blade body includes two sides 34 and 36, a blade edge region 38, a blade back 40, and a blade point 42. The blade edge region 38 is sharpened to permit the blade to cut through workpieces, and the blade point 42 may also be sharpened. The blade 26 may also include other sharpened cutting features such as a serrated edge, a saw edge, a rope cutting edge, or a gut hook, with which the present invention may be advantageously used. The present invention may be used in conjunction with a wide variety of blade designs and other features found on knife blades.

The blade/tang unit is made of a metal, preferably a steel, most preferably a 400-series stainless steel such as 440, 425, 420, or 410 stainless steel. The blade/tang unit is typically forged, fine-blanked, or laser cut to shape and then heat treated in a manner designed to produce a tough blade body 30 and tang 28. Such heat treatments are well known in the art for each type of steel. The heat treatment produces a blade/tang unit 24 that is strong, tough, and resistant to cracking. However, the heat treatment does not produce an optimally edge-retentive blade edge region 38, except as provided by the processing discussed subsequently.

Figure 3:
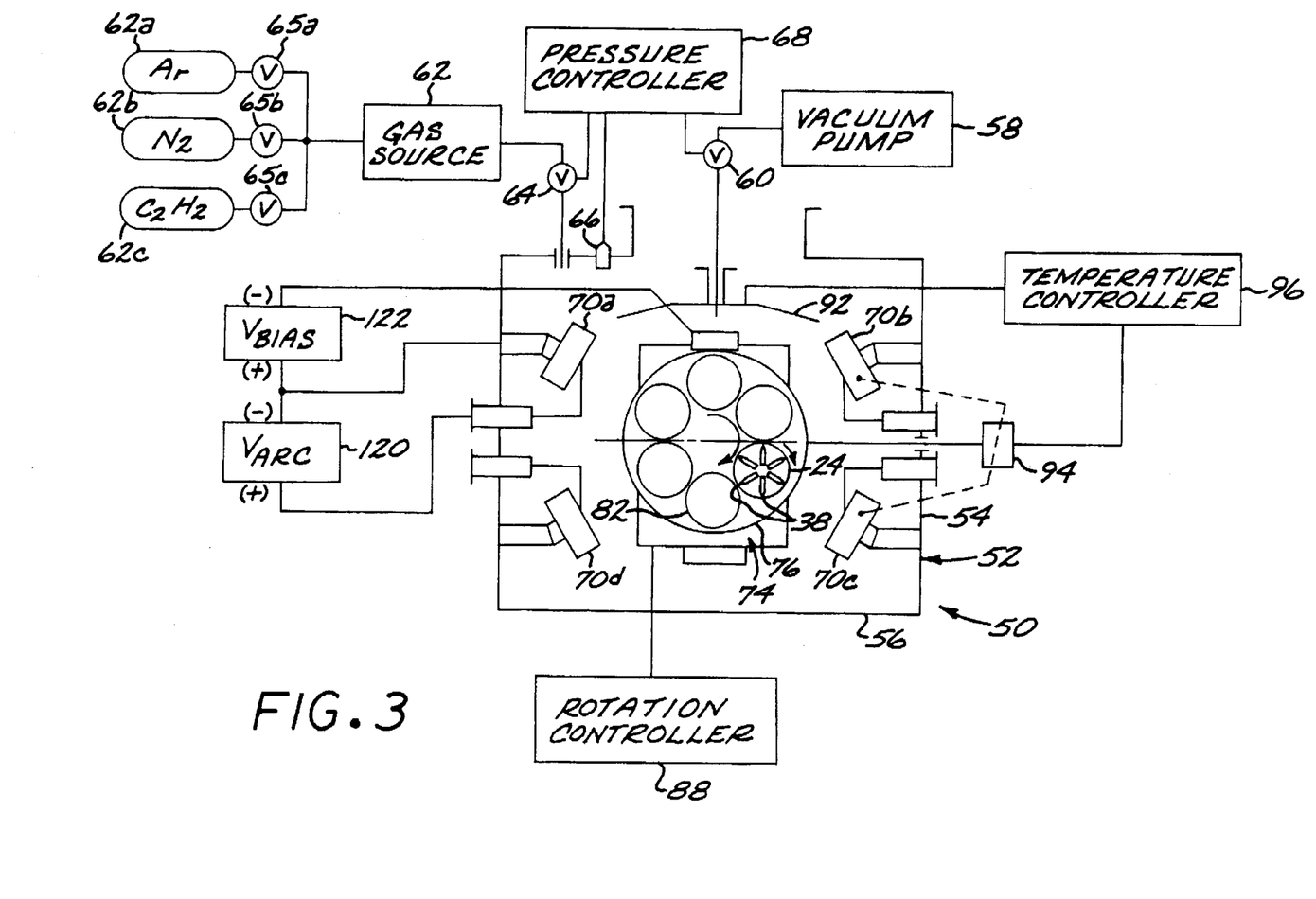
FIG. 3 is a schematic plan view and control diagram of a deposition apparatus according to the invention.
Figure 4:
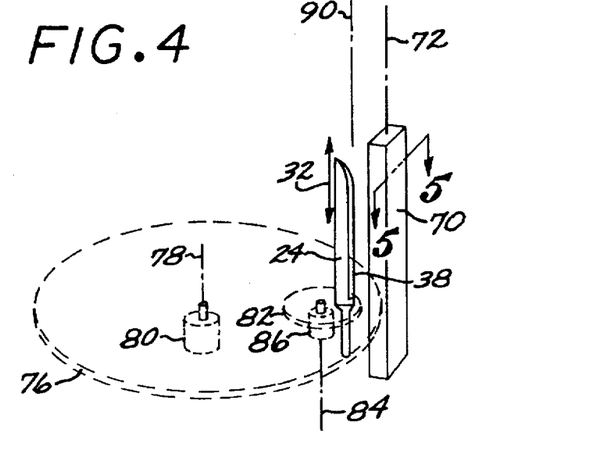
FIG. 4 is a schematic perspective view of a detail of the deposition apparatus of FIG. 3.

FIGS. 3 and 4 depict a deposition apparatus 50 used to treat the blade 26 by applying a coating that improves the edge retention of the blade edge region 38. The treatment also imparts the visually attractive, low-friction, wear-resistant, corrosion-resistant coating to the other parts of the blade 26, including the sides 34 and 36, the blade back 40, and the blade point 42. The coating may also be applied to the tang 28.

The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 operating through a gate valve 60. The vacuum pump 58 includes a mechanical pump and a diffusion pump operating together in the usual manner. The interior of the chamber 52 may controllably backfilled to a partial pressure of a selected gas from a gas source 62 through a backfill valve 64. The gas source typically includes several separately operable gases. The gas source 62 usually includes a source 62a of an inert gas such as argon, a source 62b of nitrogen gas, and a source 62c of a carbon-containing gas such as acetylene, each providing gas selectively and independently through a respective selector valve 65a, 65b, or 65c. Other types of gas can also be provided as desired.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gage 66. Thus, the gaseous backfilled atmosphere within the chamber 52 is preferably a flowing or dynamic atmosphere.

At least two, and preferably four as shown, linear deposition sources 70 are mounted within the interior of the chamber 52 in a circumferentially spaced-apart manner. In FIG. 3, the four deposition sources are identified as distinct sources 70a, 70b, 70c, and 70d, as they will be addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate during deposition procedures.

A substrate support 74 is positioned in the chamber 52. The substrate support 74 produces a compound rotational movement of a substrate mounted thereon. The preferred substrate support 74 includes a rotational carriage 76 that rotates about a rotational axis 78, driven by a rotational drive motor 80 below the rotational carriage 76. Mounted on the rotational carriage 76 are at least one and preferably six, as shown, planetary carriages 82. The planetary carriages 82 are rotationally driven about a rotational axis 84 by a planetary drive motor 86 below the planetary carriages 82. The speeds of the rotational drive motor 80 and the planetary drive motor 86 are controlled by a rotation controller 88.

For deposition processing, the blade 26 is mounted to the planetary carriage 82 with appropriate fixturing such that the blade body axis 32 is parallel to the rotational axis 84 and the blade edge region 38 faces outwardly from the rotational axis 84 and center of the planetary carriage 82. That is, as the rotational carriage 76 and the planetary carriage 82 rotate, the blade edge region 38 of at least one of the blades 26 on the planetary carriage 82 faces approximately toward the closest deposition source 70 as it passes close to the deposition source 70. This arrangement is to be contrasted with a possible alternative approach wherein the blade is intentionally oriented so that its blade edge region faces away from the deposition source 70 so as to never be in a close facing relation to the deposition sources 70. For commercial operations, multiple blades 26 are typically mounted on each planetary carriage 82 in the manner described with the blade edge regions 38 facing outwardly from the respective planetary rotational axis 84, as illustrated for one of the planetary carriages 82.

In the deposition apparatus 50, the blade body axis 32, the source axis 72, the rotational axis 78, and the rotational axis 84 are all arranged to be approximately parallel to a common axis 90.

The temperature of the blades 26 is controlled using a heater 92 that extends parallel to the deposition sources 70 on one side of the interior of the chamber 52. The heater 92 is preferably a radiant heater operating with electrical resistance elements. Experience has shown that, due to the rotational movement of the carriages 76 and 82 and the heat retention capacity of the substrate blades 26, the single heater 92 on one side of the chamber 52 provides a sufficiently uniform heating of the substrates. The temperature of the substrate blades 26 is monitored by a temperature sensor 94 such as an infrared sensor that views the interior of the chamber. The temperature measured by the sensor 94 is provided to a temperature controller 96 that provides the power output to the heater 92. Acting in this feedback manner, the temperature controller 96 allows the temperature of the substrate blades to be set. (The blades are also heated to some extent by the deposition process, so that the heater acts as the fine tuning instrument to control the temperature of the blades.) In the preferred processing of steel blades 26 with an applied titanium or titanium-compound coating, the blades 26 are heated to a temperature of from about 600° F. to about 900° F.

Figure 5:
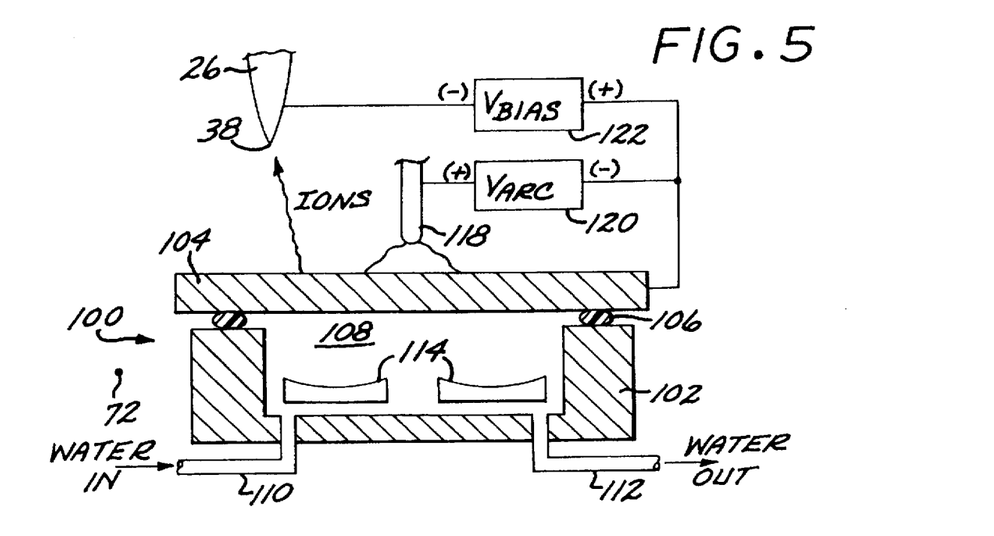
FIG. 5 is a schematic sectional view of a preferred cathodic arc source, taken along lines 4—4 of FIG. 3.

FIG. 5 illustrates a cathodic arc source 100 used in the preferred form of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two concavely shaped permanent magnets 114 extend parallel to the source axis 72. Positioned above the deposition target 104 exterior to the body 102 is a striker electrode 118. A voltage $V_{ARC}$ is applied between the striker electrode 118 and the deposition target 104 by an arc source power supply 120. $V_{ARC}$ is preferably from about 10 to about 50 volts.

The cationic material that initially forms the deposition target 104 is deposited onto the substrate blades 26, together with, if desired, gas atoms producing anionic species from the atmosphere of the chamber. In the preferred embodiment, the deposition target 104 is made of titanium (Ti) or equiatomic titanium aluminide (TiAl). Other cationic species operable as the deposition target material include metals found in Groups IV-VI of the Periodic Table, including but not limited to vanadium, chromium, zirconium, niobium, molybdenum, hafnium, tantalum, and tungsten. Other metals such as aluminum may be used. The deposition target may also be made of alloys or intermetallic compounds such as, for example, Ti-6Al-4V or Ti$_3$Al.

To accomplish the deposition, an arc is struck between the striker electrode 118 and the deposition target 104, locally heating the deposition target 104 and causing positively charged titanium or titanium aluminide ions (cations) to be ejected from the deposition target 104. (The deposition target 104 is therefore gradually thinned as the deposition proceeds.) The striking point of the arc on the deposition target 104 moves in a racetrack course along the length of the deposition target 104. A negative bias voltage $V_{BIAS}$ is applied between the deposition target 104 and the substrate blade 26 by a bias power supply 122, so that the positively charged metallic or intermetallic ions are accelerated toward the blade 26.

$V_{BIAS}$ is preferably from about −30 to about −600 volts. The value selected for $V_{BIAS}$ determines the energy of ionic impacts against the surface of the blade, a phenomenon termed ion peening. In a typical case, $V_{BIAS}$ is initially selected to be a relatively large negative voltage to achieve good adherence of the first metallic layer (discussed subsequently) to the blade substrate. $V_{BIAS}$ is subsequently reduced (made less negative) when overlying hard layers are deposited, to achieve a uniform fine microstructure in the layers. The values of $V_{BIAS}$ are desirably maintained as low as possible consistent with obtaining an adherent coating. $V_{BIAS}$ is more positive than −600 volts, and most preferably more positive than −400 volts. If $V_{BIAS}$ is too negative, corona effects and backsputtering occur in the region of the sharpened blade, dulling the blade (if already sharpened) and removing the coating already deposited into the blade edge region. Thus, while higher $V_{BIAS}$ voltages may be used for other types of articles being coated, the geometry of knives limits the $V_{BIAS}$ values that can be used with knives.

The cathodic arc source is preferred, but other types of sources such as sputtering sources may also be used.

The cooperative selection of the material of the deposition target 104 and the gases introduced into the deposition chamber from the gas source 62 allows a variety of coatings 130 to be deposited onto the knife blade 26. In all cases, the total thickness of the coating 130 is preferably from about 1½ to about 5 micrometers. If the coating thickness is less than about 1½ micrometers, the physical properties of the coating are insufficient to produce the desired results. If the coating thickness is more than about 5 micrometers, the coating has a high internal stress that leads to a tendency for the coating to crack and spall away from the knife blade 26 during deposition or during service.

Figure 6A:
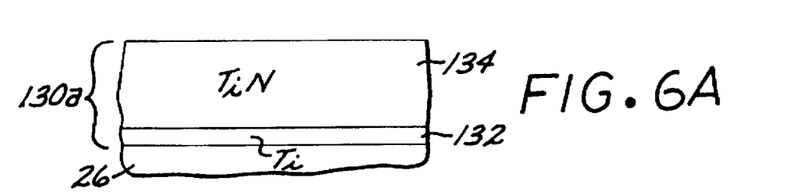
Figure 6B:
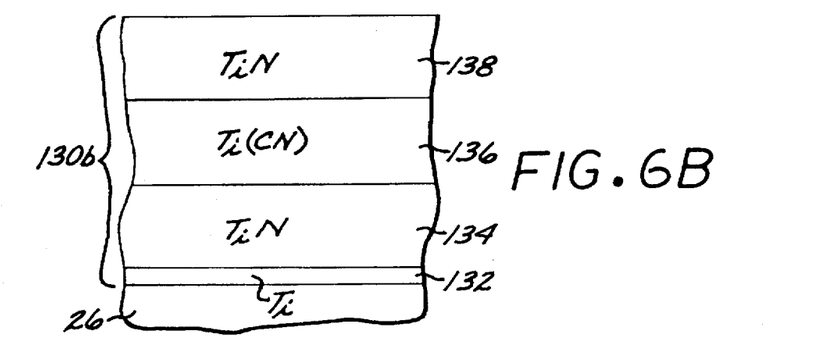
Figure 6C:
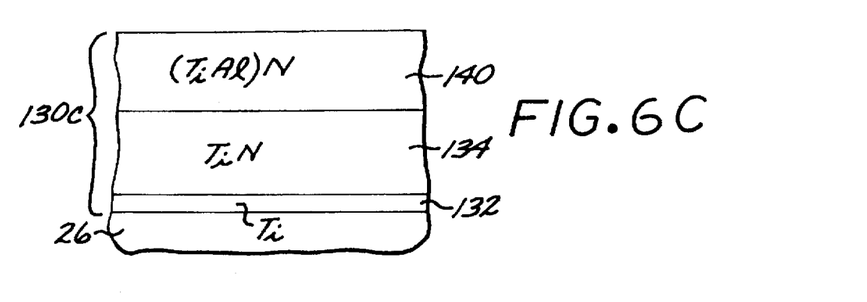

FIGS. 6A–6C depict three coating systems 130 of interest, by way of illustrating the preferred approaches and also the types of coating structures that may be produced. (These figures are not drawn to scale.) The invention is not limited to these coating systems 130, however. The coating 130a of FIG. 6A includes a first layer 132 of metallic titanium contacting the surface of the blade 26. The first metallic layer aids in adhering the overlying layer(s) to the surface of the blade. The first layer 132 is preferably quite thin, on the order of from about 100 Angstroms to about 600 Angstroms thick. The first layer 132 is deposited by backfilling the deposition chamber with a small partial pressure of about 5 microns of an inert gas such as flowing argon (flowing at a rate of about 200–450 standard cubic centimeters per minute (sccm) in the apparatus used by the inventors), and then depositing titanium from the deposition target 104 with $V_{BIAS}$ about −400 volts. Because the argon does not chemically react with the titanium, the first layer 132 is metallic titanium. A second layer 134 overlies the first layer 132. The second layer 134 is titanium nitride (TiN), which is deposited by backfilling the deposition chamber with a small partial pressure of about 5 microns of flowing nitrogen (flowing at a rate of about 150–500 sccm in the inventors' apparatus), and then depositing titanium from the deposition target 104 with $V_{BIAS}$ about −50 volts. The titanium cations combine with the nitrogen anions to produce the TiN coating in the layer 134. The second layer 134 is of a thickness such that the total thickness of the coating is from about 1½ to about 5 micrometers.

In another embodiment of a coating 130b, shown in FIG. 6B, the layers 132 and 134 are first deposited using the approach described above in relation to the coating 130a, with the layer 132 having a thickness of about 100–600 Angstroms and the layer 134 having a thickness of about ¼ to about 1 micrometer. A third layer 136 of titanium carbonitride (Ti(CN)) is deposited by backfilling the chamber with a small partial pressure of about 1–2 microns of a flowing carbon-containing gas such as acetylene (flowing at a rate of about 10–150 sccm in the inventors' apparatus) and also a partial pressure of about 3–4 microns of flowing nitrogen (flowing at a rate of about 100–300 sccm in the inventors' apparatus). The total pressure of the carbon-containing gas and nitrogen is about 5 microns. Titanium is deposited from the deposition target 104. The titanium reacts with the carbon from the carbon-containing gas and the nitrogen to deposit the titanium carbonitride third layer 136. A fourth layer 138 of TiN is deposited by repeating the steps used to deposit the second layer 134. The third layer and the fourth layer are preferably each from about ¼ to about 1 micrometer thick. Additional layers may be deposited in an alternating manner, if desired. The thicknesses of the individual layers are selected so that the total thickness of the coating is from about 1½ to about 5 micrometers.

In another embodiment of a coating 130c, shown in FIG. 6C, the layers 132 and 134 are first deposited as described for the coating 130a, in respective thicknesses of about 100–600 Angstroms and about ¼ to about 1 micrometer. A third layer 140 of titanium aluminonitride ((TiAl)N) is deposited by backfilling the chamber with a small partial pressure of about 5 micrometers of flowing nitrogen (flowing at about 100–300 sccm in the inventors' apparatus), and then depositing titanium aluminide from the deposition target 104. The titanium aluminide cationic species reacts with the nitrogen anionic species to produce the third layer.

When titanium is the only cationic species to be deposited into the coating 130, as in the embodiments of FIGS. 6A and 6B, all of the deposition sources 70a, 70b, 70c, and 70d utilize titanium deposition targets 104. When another cationic species such as aluminum is to be deposited with the titanium, as in the embodiment of FIG. 6C, some of the deposition sources utilize titanium deposition targets and some of the deposition sources utilize alloy deposition targets such as TiAl deposition targets. For example, to deposit the coating of FIG. 6C, the deposition sources 70a and 70c are made with titanium deposition targets 104, and the deposition sources 70b and 70d are made with titanium-aluminum deposition targets 104. The pair of sources 70a and 70c is operated during deposition of the layer 132 (with inert gas in the chamber) and the layer 134 (with nitrogen gas in the chamber), and the pair of sources 70b and 70d is operated during deposition of the layer 140 (with nitrogen gas in the chamber).

The use of various layers within the coating 130 yields results of two different types. First, the mechanical and physical properties of the coating are varied according to the types, hardnesses, and thicknesses of the layers. Second, the color of the coating depends upon the layer which is exposed at the top of the coating. The color produced by this coating technique is long-lasting and will not readily spall or be worn away from the surface because of the hardness of the coating, a desirable feature because the knife blade exhibits an attractive external appearance. For example, a TiN top coating is a golden yellow color, whereas a (TiAl)N top coating is a lustrous gray color. Other coatings such as $Ti_2N$ and (TiAl)(CN) may be applied to vary the properties and color of the coating.

Figure 7:
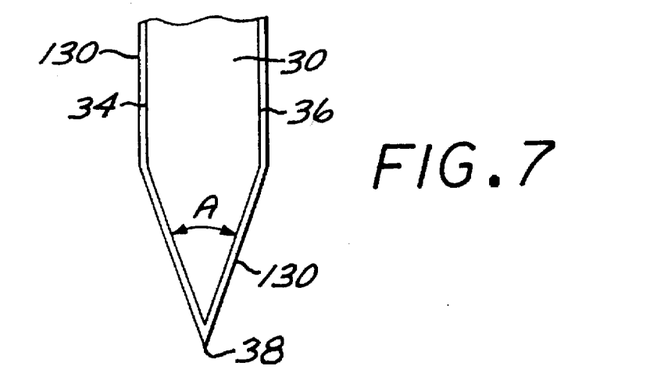
FIG. 7 is an enlarged sectional view like that of FIG. 2, for a coated knife blade sharpened on both sides.
Figure 8A:
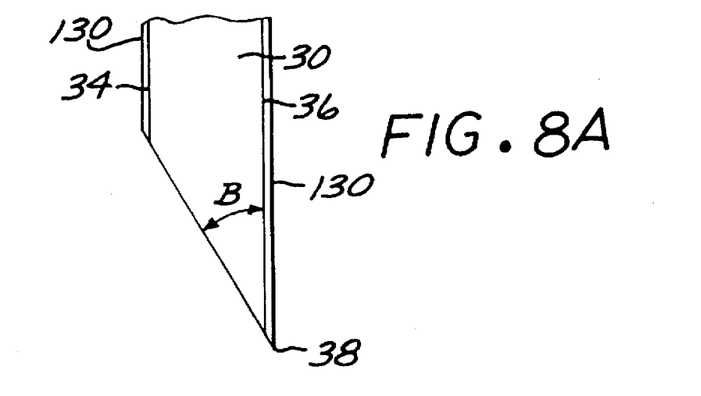
FIG. 8A is an enlarged sectional view like that of FIG. 2, for a knife blade first coated on both sides and then sharpened on one side only.
Figure 8B:
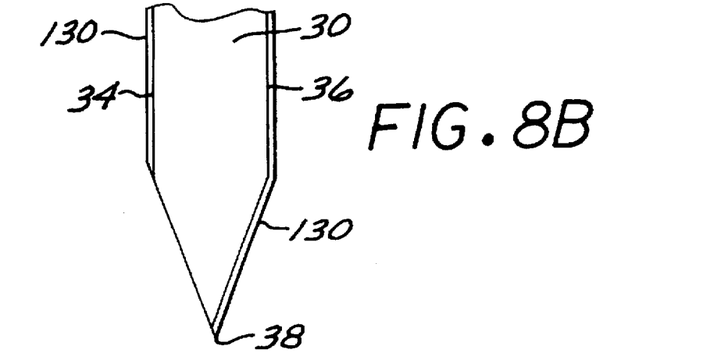
FIG. 8B is an enlarged sectional view like that of FIG. 2, for a knife blade first sharpened on both sides, then coated on both sides, and then resharpened on one side only.

FIGS. 7 and 8 illustrate three configurations of the knife blade body 30 and the blade edge region 38, with the thickness of the coating 130 exaggerated so that its location may be seen. In the blade of FIG. 7A, both sides 34 and 36 of the blade are first sharpened. That is, material from both sides 34 and 36 is removed to define the sharp point at the edge region 38, prior to depositing the coating 130, and the blade is not further sharpened after coating. The included sharpening angle A is typically about 12–13 degrees. By contrast, in the embodiments of FIGS. 8A and 8B, one side 34 of the final blade is sharpened after coating. In the embodiment of FIG. 8A, the blade is coated on both sides and thereafter material from only one side 34 is removed to define the sharp point at the edge region 38. The included sharpening angle B is typically about 19–23 degrees. The embodiment of FIG. 8A has the disadvantage for some applications that it has a chisel-like appearance, which is different from the appearance many knife users prefer. To achieve one-side sharpening with a more-conventional appearance as shown in FIG. 8B, the blade edge region is first sharpened on both sides, the blade is coated on both sides, and after sharpening only one of the sides is resharpened. The embodiments of FIGS. 8A and 8B are both within the scope of the concept of one-sided sharpening, as used herein. In the embodiments of FIGS. 8A and 8B, the coating 130 extends to the edge region 38 on the side 36 of the blade and will always extend to the edge region even after repeated resharpening, as long as those resharpenings remove material from only the one side 34.

Figure 9:
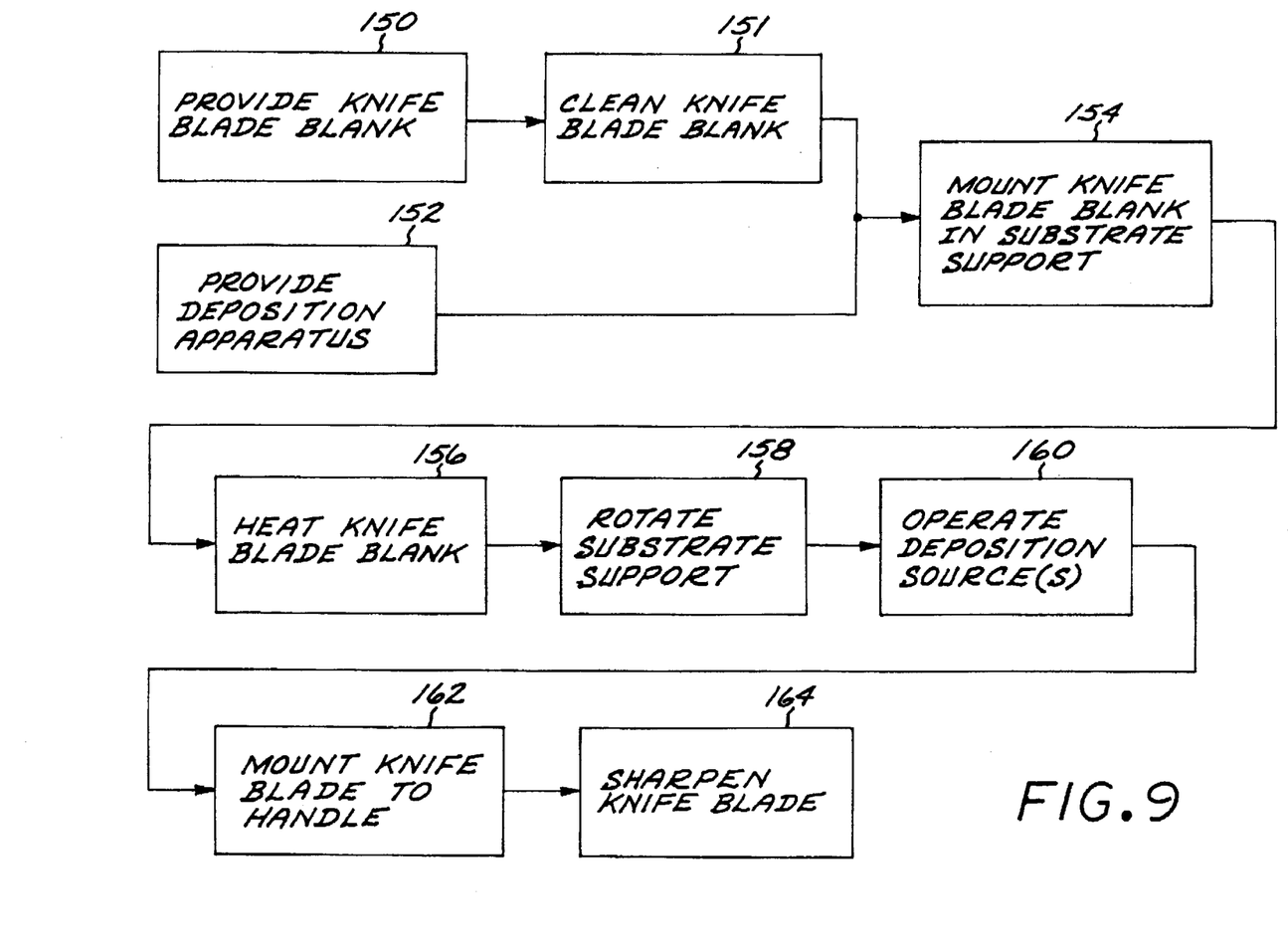
FIG. 9 is a block process flow diagram for a preferred method for preparing a knife blade according to the invention.

FIG. 9 is a block flow diagram for a method of practicing the invention. A knife blade blank is provided, numeral 150. The knife blade blank is typically in the form of the blade 26 or the blade/tang unit 24 where appropriate. The knife blade blank is formed to the desired shape and heat treated to $R_C$ 57–60 in the case of a 400-series stainless steel blank. It may be provided with the blade edge region in the sharpened form or the unsharpened form, depending upon the desired final blade configuration. The knife blade blank is carefully cleaned, numeral 151, in an aqueous alkaline soap solution to remove grease, dirt, and other surface contaminants. The deposition apparatus is provided, numeral 152, preferably in the form described previously. The knife blade blank is mounted to the planetary carriage of the deposition apparatus, with the blade edge region of the blank facing outwardly from the center of the planetary carriage, numeral 154. In a production operation, a plurality of knife blade blanks are mounted to each planetary carriage.

The heater is activated to bring the knife blade blanks to about the temperature of deposition, preferably about 600–900° F., numeral 156. As the deposition processing proceeds, the knife blade blanks are also heated by the deposition operation, so that the power to the heater can be reduced somewhat. The feedback temperature controller 96 operates to maintain the temperature at a selected setpoint value. The rotation controller 88 is activated to rotate the rotational carriage at a rate of about 1 revolution per minute (rpm) and the planetary carriage at a rate of about 1½ rpm, numeral 158.

The deposition sources are operated to deposit the coating 130 onto the knife blade blanks, numeral 160, while the heating step 156 and the rotational step 158 continue concurrently with the deposition. As discussed in relation to FIGS. 6, the operating conditions are selected to produce the desired layers within the coating. In a typical case, the current between the striker and the deposition target for each of the cathodic arc sources is 90–150 Amperes, $V_{BIAS}$ is in the range of −30 to −600 volts, and the backfill gas pressure of inert or reactive gas is about 2–6 microns, most preferably about 5 microns. Deposition is continued for a period sufficient to deposit from about 1½ to about 5 micrometers total thickness of material in the coating. By way of example of typical operating times, to produce the coating of FIG. 6A, the cathodic arc sources are operated for about 1–4 minutes with an argon backfill to produce the first layer 132 and then for about 90 minutes with a nitrogen backfill to produce the second layer 134. To produce the coating of FIG. 6C, the two cathodic arc sources using a titanium deposition target are operated for about 1–4 minutes with an argon backfill to produce the first layer 132, the same sources are operated for about 30 minutes with a nitrogen backfill to produce the second layer 134, and thereafter the two cathodic arc sources using a titanium aluminide deposition target are operated for about 30 minutes with a nitrogen backfill to produce the third layer 140. In these processes, $V_{BIAS}$ is desirably about –400 volts to deposit the first layer of titanium, and thereafter $V_{BIAS}$ is reduced to about –50 volts to deposit the remaining layers. The result is a strongly adherent coating.

The knife blade is mounted to the handle, numeral 162.

The knife blade edge region 38 is optionally sharpened, numeral 164. If the knife blade blank is furnished in the sharpened condition at numeral 150 and the blade is to have the two-sided configuration of FIG. 7, further sharpening is not required after the coating is deposited. If the knife blade blank is furnished in the unsharpened condition at numeral 150 or if the knife blade is to have the configuration of FIG. 8B, sharpening is required at numeral 164.

The sharpening can be accomplished by removing material from two sides of the knife blade to produce a knife blade such as shown in FIG. 7, or by removing material from only one side of the knife blade to produce a knife blade such as shown in FIG. 8. As will be seen in the following discussion of results, the latter is preferred. In all cases, sharpening is accomplished by conventional procedures using abrasive grinding and then a final stropping of the blade.

To test the effectiveness of the approach of the invention, a number of blades for a Buck Knives model 110 knife were prepared using conventional procedures, other coating techniques, and the approach of the invention. The blades were sharpened in the manner discussed subsequently. The blades were tested for cutting performance by slicing the knife blade into a sheet of silica-impregnated paper multiple times, with a controlled weight applied to the knife blade. The depth of the cut was measured as a function of the number of cuts. This test is known to give a good accelerated indication of knife blade sharpness retention.

Figure 10:
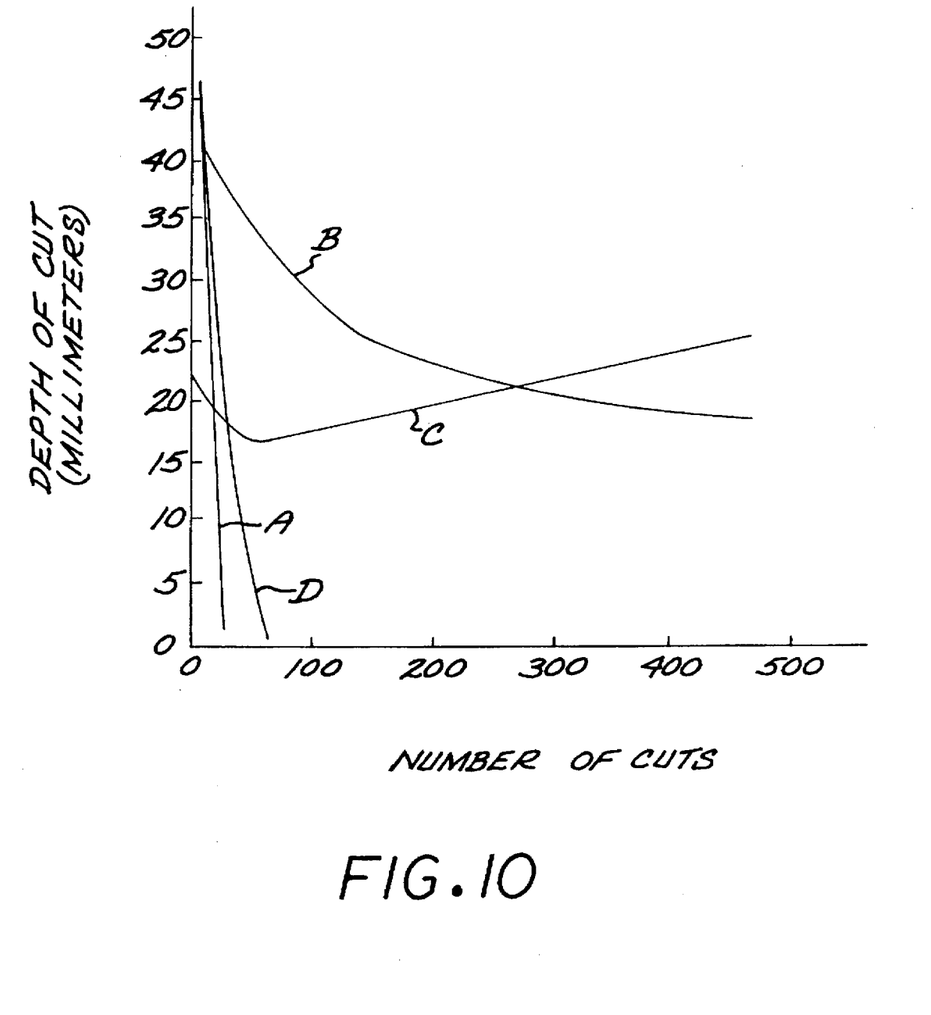
FIG. 10 is a graph showing comparative depth of cut test results for knife blades prepared according to the invention and for knife blades prepared by other techniques.

Test results are shown in FIG. 10. Curve A illustrates the cutting performance for a conventionally processed blade with no coating, and sharpened on two sides. The depth of cut was initially high, but fell rapidly so that the blade had lost its effectiveness for cutting after about 30 cuts. Curve B illustrates the cutting performance of a blade processed in the manner discussed in relation to FIG. 8B: initial two-sided sharpening, coating with the coating structure of FIG. 6A, and thereafter sharpened on one side only to about the same degree of sharpness as the blade of Curve A. The coated blade of Curve B produces a performance that is many times greater than the conventional uncoated blade. Curve C illustrates the cutting performance of a blade processed in the manner discussed in relation to FIG. 8A: no presharpening, coating, and sharpening on one side only. The coating applied was like that of FIG. 6B, except that the fourth layer 138 was omitted. The exposed layer was therefore Ti(CN), which had a violet color. The blade of Curve C was initially sharpened to a lesser sharpness than those of Curves A and B. Most surprisingly, the depth of cut actually increased with increasing number of cuts, after a 50-cut breakin period. The reason for this increase in cut depth is not known with certainty, but it may be related to the abrasive action of the silica-impregnated paper on the sharpened side. Curve D illustrates the cutting performance of a blade hard coated by a vendor with TiCN using a point deposition source and without the blade substrate facing toward the deposition source and experiencing continuous rotation. The approach yielded slightly improved results over the uncoated blade, but the coating was observed to have generally poor adherence to the substrate and to be removed easily during the testing by frictional contact.

Thus, the present invention produces results far superior to those obtained with conventional processing and state-of-the-art alternative processing.

The invention has been described in relation to its preferred embodiment that uses titanium as the cationic species to produce the hard coating. Other species and alloys may also be used, as discussed previously. Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing a knife, comprising the steps of:
providing a knife blade blank having a blade edge region with two sides;
providing a deposition apparatus comprising
at least two linear deposition sources, each of the deposition sources lying parallel to an axis and each of the deposition sources being a source of a cationic species,
an anion source of an anionic species reactive with the cationic species to produce a coating material,
a substrate support adapted for rotational movement about the axis, and
a substrate heater;
mounting the knife blade blank in the substrate support such that the blade edge region lies generally parallel to the axis and such that the blade edge region faces each respective deposition source at about its position of closest approach to the respective deposition source;
heating the knife blade blank to a substrate deposition temperature;
rotating the substrate support about the axis; and
operating the deposition sources to deposit the respective coating material onto the knife blade blank, the steps of heating, rotating, and operating to occur simultaneously.

2. The method of claim 1, wherein each of the deposition sources comprises a cathodic arc source.

3. The method of claim 1, wherein the step of operating includes the step of
operating the deposition sources for a period sufficient to deposit from about 1½ to about 5 micrometers of the coating material onto the blade edge region.

4. The method of claim 1, wherein the step of providing a deposition apparatus includes the step of
providing at least two deposition sources of a compound of titanium.

5. The method of claim 1, wherein the step of providing a knife blade blank includes the step of
providing a knife blade blank having a sharpened blade edge region.

6. The method of claim 1, including an additional step, after the steps of rotating and operating, of
sharpening the blade edge region.

7. The method of claim 6, wherein the step of providing a knife blade blank includes the step of
providing a knife blade blank having an unsharpened blade edge region.

8. The method of claim 6, wherein the step of sharpening the blade edge region includes the step of sharpening the blade edge region on one side only.

9. The method of claim 6, wherein the step of sharpening the blade edge region includes the step of sharpening the blade edge region on two sides.

10. A knife prepared by the method of claim 1.

11. A method for preparing a knife, comprising the steps of:

providing a steel knife blade blank having a blade edge region with two sides;

providing a deposition apparatus comprising at least two linear deposition sources, each of the deposition sources lying parallel to an axis and each of the deposition sources being a source of a cationic species, an anion source of an anionic species reactive with the cationic species to produce a coating material, a substrate support adapted for two-mode rotational movement about the axis, the two modes of rotational movement including a circular movement and a planetary movement, and a substrate heater;

mounting the knife blade blank in the substrate support such that the blade edge region lies generally parallel to the axis and such that the blade edge region faces each respective deposition source at about its position of closest approach to the respective deposition source;

heating the knife blade blank to a substrate deposition temperature;

electrically negatively biasing the knife blade blank with respect to the deposition source;

rotating the substrate support about the axis; and, simultaneously with the steps of heating, biasing, and rotating; and operating the deposition sources to deposit a coating onto the knife blade blank in a thickness of from about 1½ to about 5 micrometers, the coating comprising a first layer of titanium adjacent to the blade edge region and a second layer adjacent to the first layer, the second layer comprising a compound of titanium and at least one of carbon and nitrogen.

12. The method of claim 11, wherein the step of providing a knife blade blank includes the step of providing a knife blade blank having a sharpened blade edge region.

13. The method of claim 11, including an additional step, after the steps of rotating and operating, of sharpening the blade edge region.

14. The method of claim 13, wherein the step of sharpening the blade edge region includes the step of sharpening the blade edge region on one side only.

15. A knife prepared by the method of claim 11.

* * * * *